US008827339B2

(12) United States Patent
Takemura et al.

(10) Patent No.: US 8,827,339 B2
(45) Date of Patent: Sep. 9, 2014

(54) ROBOT HAND

(75) Inventors: Shinichi Takemura, Tokyo (JP); Hiroyasu Ihara, Tokyo (JP)

(73) Assignee: JX Nippon Oil & Energy Corporation, Tokyo (JP)

( * ) Notice: Subject to any disclaimer, the term of this patent is extended or adjusted under 35 U.S.C. 154(b) by 49 days.

(21) Appl. No.: 13/582,511

(22) PCT Filed: Mar. 3, 2011

(86) PCT No.: PCT/JP2011/054992
§ 371 (c)(1),
(2), (4) Date: Nov. 19, 2012

(87) PCT Pub. No.: WO2011/108676
PCT Pub. Date: Sep. 9, 2011

(65) Prior Publication Data
US 2013/0057008 A1 Mar. 7, 2013

(30) Foreign Application Priority Data

Mar. 4, 2010 (JP) ................................ 2010-048020
Mar. 4, 2010 (JP) ................................ 2010-048023

(51) Int. Cl.
| | | |
|---|---|---|
| B65G 49/07 | (2006.01) | |
| H01L 21/683 | (2006.01) | |
| B25J 9/00 | (2006.01) | |
| H01L 21/687 | (2006.01) | |
| B25J 15/00 | (2006.01) | |
| B65G 49/06 | (2006.01) | |
| H01L 21/677 | (2006.01) | |

(52) U.S. Cl.
CPC ......... *B25J 9/0012* (2013.01); *H01L 21/68757* (2013.01); *B25J 15/00* (2013.01); *B65G 49/061* (2013.01); *H01L 21/67742* (2013.01); *H01L 21/68707* (2013.01); *Y10S 294/902* (2013.01)
USPC ......................................... 294/213; 294/902

(58) Field of Classification Search
CPC ............ H01L 21/683; H01L 21/68757; H01L 21/68707; B25J 11/0095; B25J 15/0014; Y10S 294/902; Y10S 901/31
USPC ........ 294/213, 902; 414/935–941; 901/30, 50
See application file for complete search history.

(56) References Cited

U.S. PATENT DOCUMENTS 6,499,777 B1 * 12/2002 Wang .............................. 294/213
6,893,712 B2 * 5/2005 Aoyagi et al. .............. 428/297.4
(Continued)

FOREIGN PATENT DOCUMENTS

| JP | 3-59830 | 6/1991 |
|---|---|---|
| JP | 3-166921 | 7/1991 |

(Continued)

OTHER PUBLICATIONS

International Search Report issued with respect to PCT/JP2011/054992, mailed Apr. 12, 2011.
English-language translation of International Preliminary Report on Patentability issued with respect to PCT/JP2011/054992, mailed Oct. 11, 2012.

*Primary Examiner* — Dean Kramer
(74) *Attorney, Agent, or Firm* — Greenblum & Bernstein, P.L.C.

(57) ABSTRACT

A robot hand having an attachment portion that is held when incorporated into a robot includes CFRP laminated to each other and a vibration-damping elastic layer that is disposed between the CFRP layer and the CFRP layer. The vibration-damping elastic layer includes viscoelastic resin regions including a viscoelastic resin and a high-rigidity resin region including high-rigidity resin. The viscoelastic resin regions and the high-rigidity resin region are alternately arranged along the direction intersecting the longitudinal direction of the CFRP layer in the attachment portion. The viscoelastic resin regions improve vibration-damping properties on the robot hand. As the viscoelastic resin regions and the high-rigidity resin region having relatively higher rigidity are alternately arranged along the direction intersecting the longitudinal direction of the CFRP layers, flexural rigidity along the longitudinal direction of the CFRP layer is improved.

8 Claims, 16 Drawing Sheets

(56) References Cited

U.S. PATENT DOCUMENTS

| | | | |
|---|---|---|---|
| 7,833,455 B2 * | 11/2010 | Kobayashi et al. | 264/258 |
| 7,871,705 B2 * | 1/2011 | Miller et al. | 428/418 |
| 2008/0247857 A1 * | 10/2008 | Yuasa et al. | 414/680 |
| 2008/0277057 A1 * | 11/2008 | Montgomery et al. | 156/307.1 |

FOREIGN PATENT DOCUMENTS

| | | |
|---|---|---|
| JP | 2002-292591 | 10/2002 |
| JP | 2005-150510 | 6/2005 |
| JP | 2006-289591 | 10/2006 |
| JP | 2009-160685 | 7/2009 |

* cited by examiner

Fig.6
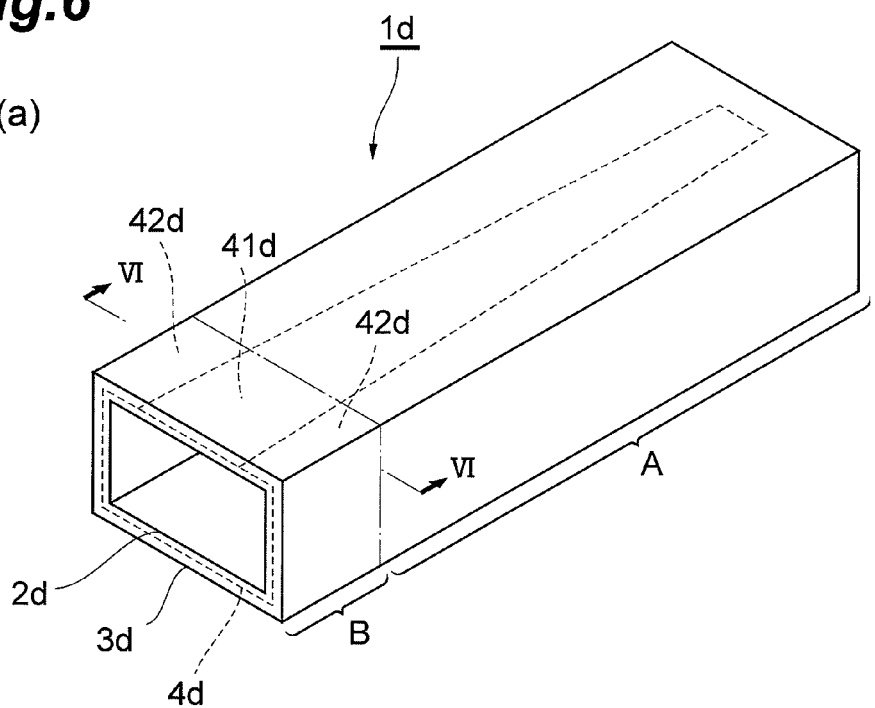
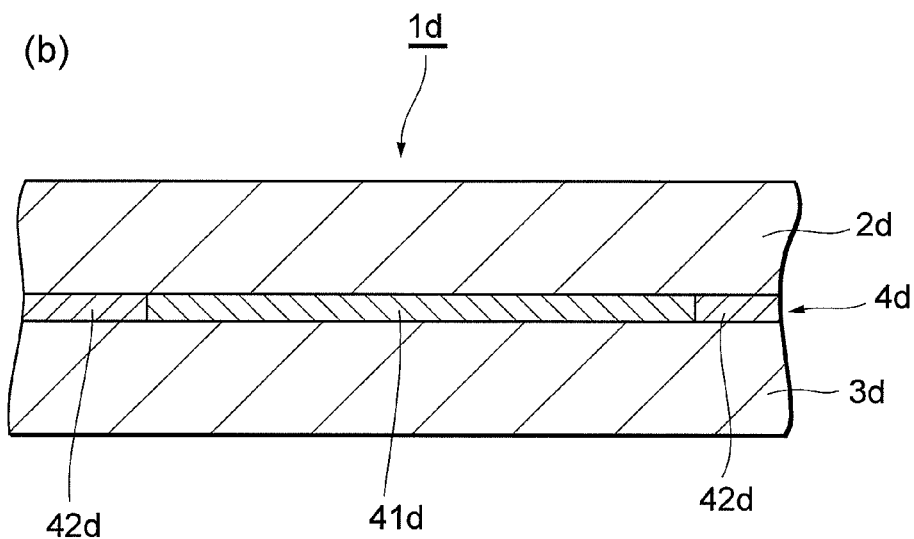

Fig.7
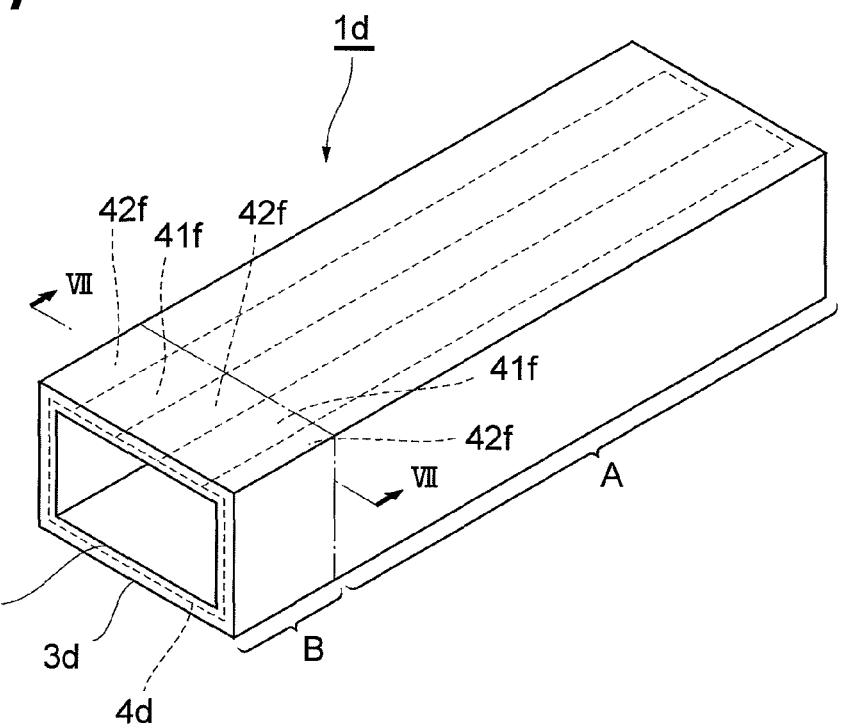
(a)
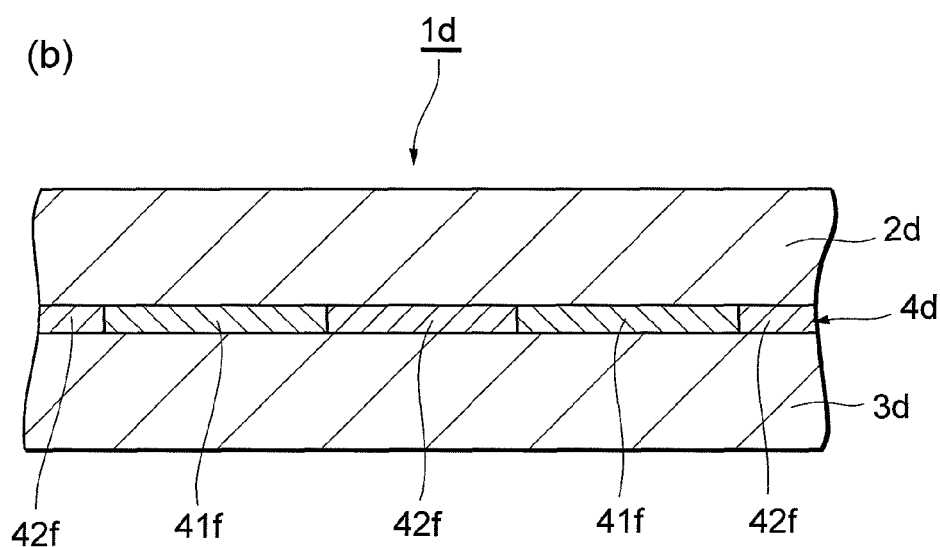
(b)

Fig.15
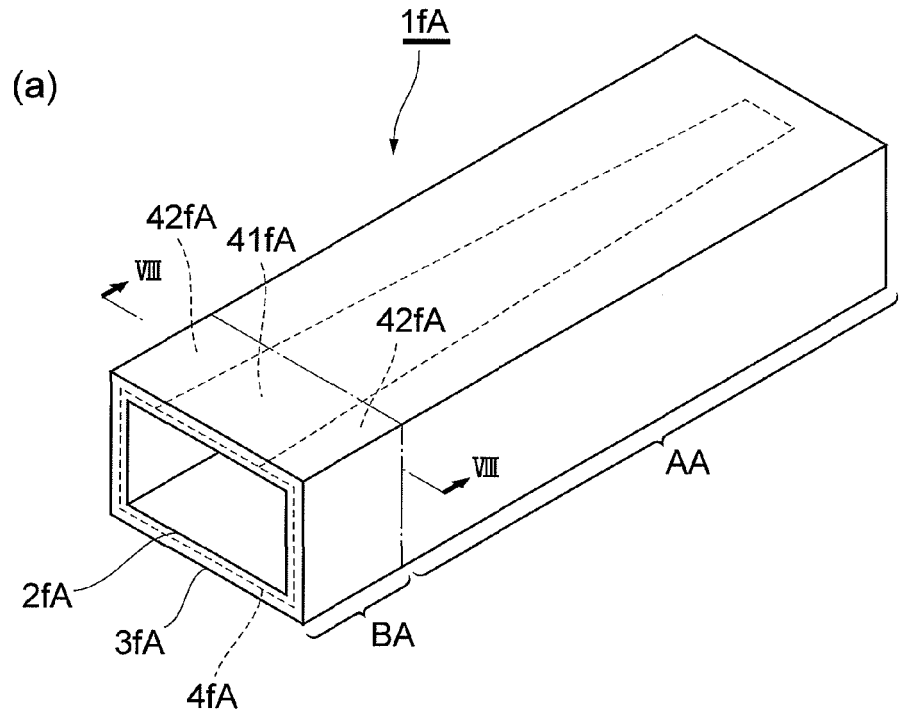
(a)
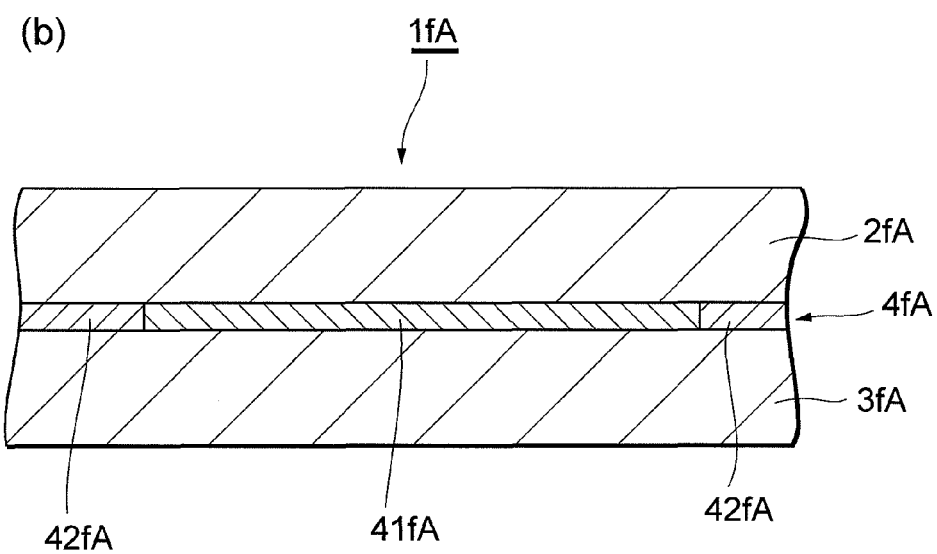
(b)

Fig.16
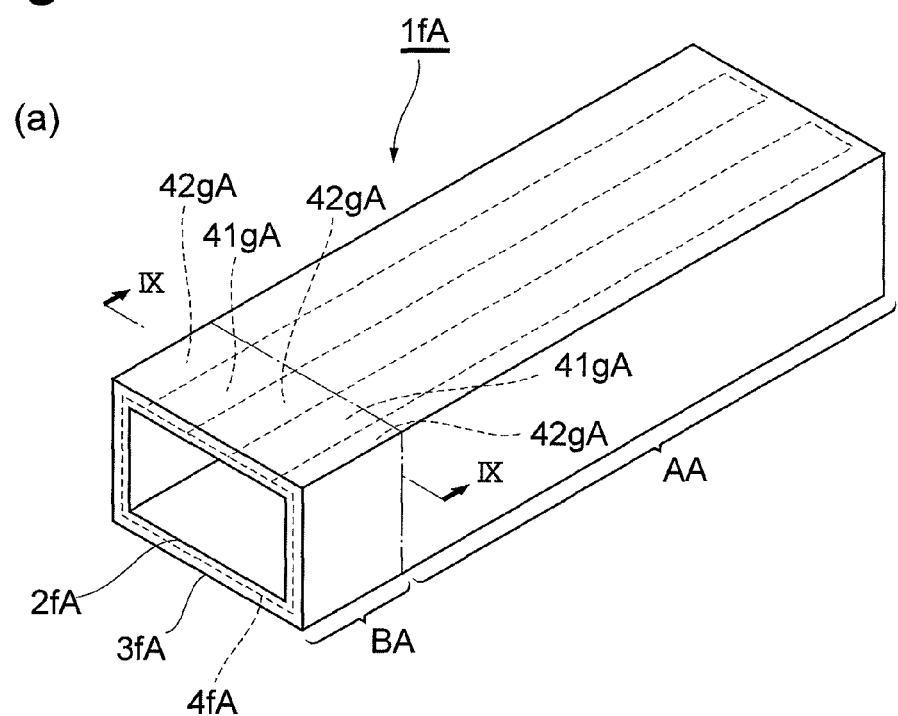
(a)
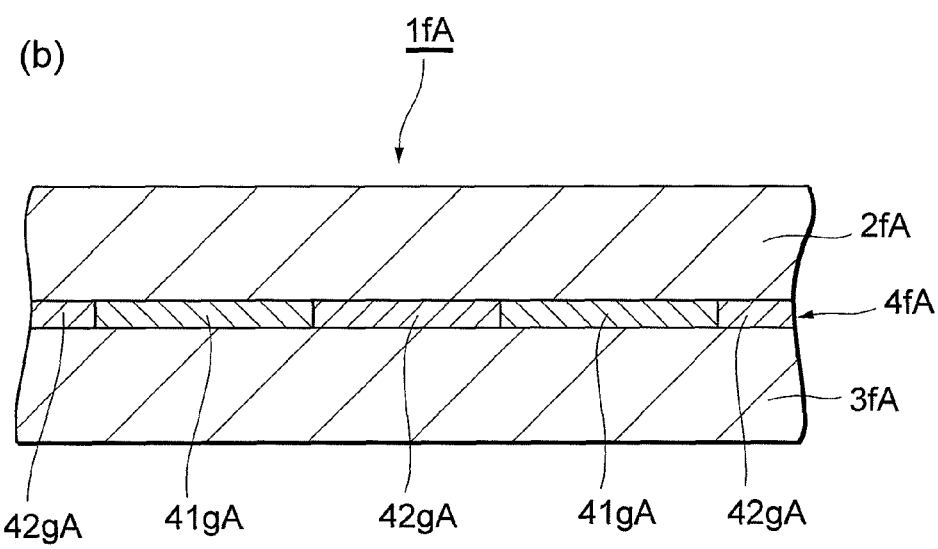
(b)

ROBOT HAND

TECHNICAL FIELD

The present invention relates to a robot hand applied to an industrial robot, for example.

BACKGROUND ART

Conventionally, as a robot hand that is applied to an industrial robot or the like for conveying glass substrates or semiconductor substrates, a robot hand manufactured from a carbon-fiber-reinforced plastic has been known (see Patent Literature 1, for example). Such a robot hand is lighter in weight and has higher rigidity in comparison with one manufactured from metals such as aluminum and iron.

CITATION LIST

Patent Literature

[Patent Literature 1] Japanese Patent Application Laid-Open Publication No. 2002-292591

SUMMARY OF INVENTION

Technical Problem

However, as carbon-fiber-reinforced plastics themselves are poor in vibration-damping properties, a robot hand manufactured from the above-mentioned carbon-fiber-reinforced plastic is also poor in vibration-damping properties. Accordingly, in a robot hand configured to include a carbon-fiber-reinforced plastic, it is required to improve vibration-damping properties while maintaining a certain level of flexural rigidity.

In view of this, an objective of the present invention is to provide a robot hand making it possible to improve vibration-damping properties while maintaining flexural rigidity.

Solution to Problem

To achieve the above-mentioned objective, a robot hand according to the present invention is a robot hand having an attachment portion that is held when incorporated into a robot, the robot hand including first and second carbon-fiber-reinforced plastic layers laminated to each other and a vibration-damping elastic layer disposed between the first carbon-fiber-reinforced plastic layer and the second carbon-fiber-reinforced plastic layer, in which the vibration-damping elastic layer includes a viscoelastic resin region including a viscoelastic resin and a high-rigidity resin region including a high-rigidity resin that has higher rigidity than that of the viscoelastic resin, and the viscoelastic resin region and the high-rigidity resin region are alternately arranged in the attachment portion.

When this robot hand is incorporated into the robot, the attachment portion is held. In this case, the vibration-damping elastic layer having the viscoelastic resin region including the viscoelastic resin is disposed between the first carbon-fiber-reinforced plastic layer and the second carbon-fiber-reinforced plastic layer, whereby vibration-damping properties are improved. In addition, the viscoelastic resin region and the high-rigidity resin region having relatively high rigidity are alternately arranged in the attachment portion, whereby flexural rigidity is secured.

In the robot hand according to the present invention, it is preferable that the high-rigidity resin be the same as a resin constituting the first and the second carbon-fiber-reinforced plastic layers, and the high-rigidity resin region be formed integrally with the first and the second carbon-fiber-reinforced plastic layers. With this configuration, when integrally forming the first and the second carbon-fiber-reinforced plastic layers and the vibration-damping elastic layer, it is possible to easily form the high-rigidity resin region with the resin constituting the first and the second carbon-fiber-reinforced plastic layers.

In the robot hand according to the present invention, to the high-rigidity resin region, a heat-transfer medium flow path for circulating heat-transfer medium therethrough is preferred to be provided along an outer border of the viscoelastic resin region. With this configuration, by circulating heat-transfer medium through the heat-transfer medium flow path provided to the high-rigidity resin region, temperature of the robot hand can be preferably adjusted. Particularly because the heat-transfer medium flow path is provided along the outer border of the viscoelastic resin region, temperature of the viscoelastic resin region can be efficiently adjusted.

In addition, to achieve the above-mentioned objective, a robot hand according to another aspect of the present invention is characterized to include first and second carbon-fiber-reinforced plastic layers laminated to each other, and a vibration-damping elastic layer disposed between the first carbon-fiber-reinforced plastic layer and the second carbon-fiber-reinforced plastic layer, in which the vibration-damping elastic layer includes a viscoelastic resin region made of a material containing a viscoelastic resin and a fibrous substance dispersed in the viscoelastic resin, and the fibrous substance has higher rigidity than that of the viscoelastic resin.

In this robot hand, between the first carbon-fiber-reinforced plastic layer and the second carbon-fiber-reinforced plastic layer, the vibration-damping elastic layer including the viscoelastic resin and the fibrous substance that is dispersed in the viscoelastic resin and has a relatively higher rigidity is disposed, which makes it possible to improve flexural rigidity while maintaining vibration-damping properties.

In the robot hand according to the present invention, it is preferable that the vibration-damping elastic layer further includes a high-rigidity resin region including a high-rigidity resin that has higher rigidity than that of the viscoelastic resin, and the viscoelastic resin region and the high-rigidity resin region be alternately arranged in an attachment portion that is held when the robot hand is incorporated into a robot. With this configuration, when the robot hand is incorporated into the robot, the attachment portion is held. In this case, as the viscoelastic resin region and the high-rigidity resin region having relatively higher rigidity are alternately arranged in the attachment portion, flexural rigidity is improved.

In the robot hand according to the present invention, it is preferable that the high-rigidity resin be the same as a resin constituting the first and the second carbon-fiber-reinforced plastic layers, and the high-rigidity resin region be formed integrally with the first and the second carbon-fiber-reinforced plastic layers. With this configuration, when integrally molding the first and the second carbon-fiber-reinforced plastic layers and the vibration-damping elastic layer, it is possible to easily form the high-rigidity resin region with the resin constituting the first and the second carbon-fiber-reinforced plastic layers.

In the robot hand according to the present invention, to the high-rigidity resin region, a heat-transfer medium flow path for circulating heat-transfer medium therethrough is preferred to be provided along an outer border of the viscoelastic resin region. With this configuration, by circulating heat-transfer medium through the heat-transfer medium flow path provided to the high-rigidity resin region, temperature of the robot hand can be preferably adjusted. Particularly as the heat-transfer medium flow path is provided along the outer border of the viscoelastic resin region, temperature of the viscoelastic resin region can be preferably adjusted.

In the robot hand according to the present invention, the fibrous substance is preferred to be at least one out of carbon nanotube, Ketjenblack, short glass fiber, and short carbon fiber. With this configuration, it is possible to preferably improve flexural rigidity using carbon nanotube, Ketjenblack, short glass fiber, and short carbon fiber.

Advantageous Effects of Invention

According to the present invention, it becomes possible to provide a robot hand making it possible to improve vibration-damping properties while maintaining flexural rigidity.

BRIEF DESCRIPTION OF DRAWINGS

FIG. 6(a) is a perspective view of a third embodiment of the robot hand according to the present invention, and FIG. 6(b) is a partial sectional view along a line VI-VI in FIG. 6(a).

FIG. 7(a) is a perspective view illustrating another aspect of a vibration-damping elastic layer depicted in FIG. 6, and FIG. 7(b) is a partial sectional view along a line VII-VII in FIG. 7(a).

FIG. 15(a) is a perspective view of a seventh embodiment of the robot hand according to the present invention, and FIG. 15(b) is a partial sectional view along a line VIII-VIII in FIG. 15(a).

FIG. 16(a) is a perspective view illustrating another aspect of a vibration-damping elastic layer depicted in FIG. 15, and FIG. 16(b) is a partial sectional view along a line IX-IX in FIG. 16(a).

DESCRIPTION OF EMBODIMENTS

Preferred embodiments of the present invention will be described hereinafter with reference to the attached drawings. Note that like numerals are given to like or corresponding components in each of the drawings, and duplicate descriptions will be omitted.

First Embodiment

Figure 1:
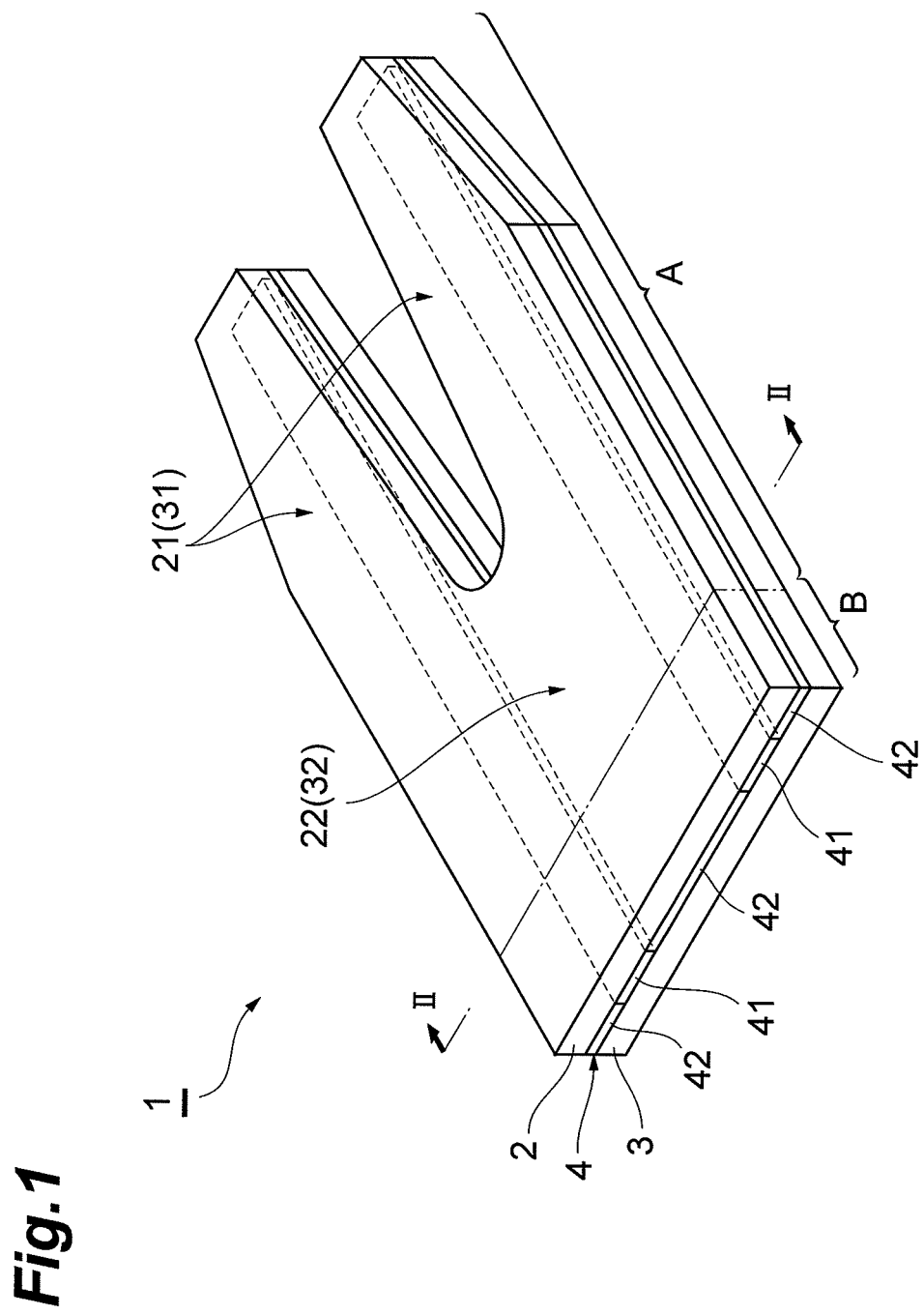
FIG. 1 is a perspective view of a first embodiment of a robot hand according to the present invention.

As depicted in FIG. 1, a robot hand 1 includes a main portion A and an attachment portion B that is provided in a manner extending from one end of the main portion A and is held when the robot hand 1 is incorporated into a robot. This robot hand 1 can be applied to an industrial robot for conveying glass substrates or semiconductor substrates, for example. In this case, the robot hand 1 is fixed on the industrial robot via the attachment portion B, and an object to be conveyed such as a glass substrate or a semiconductor substrate is placed on the main portion A.

Figure 2:
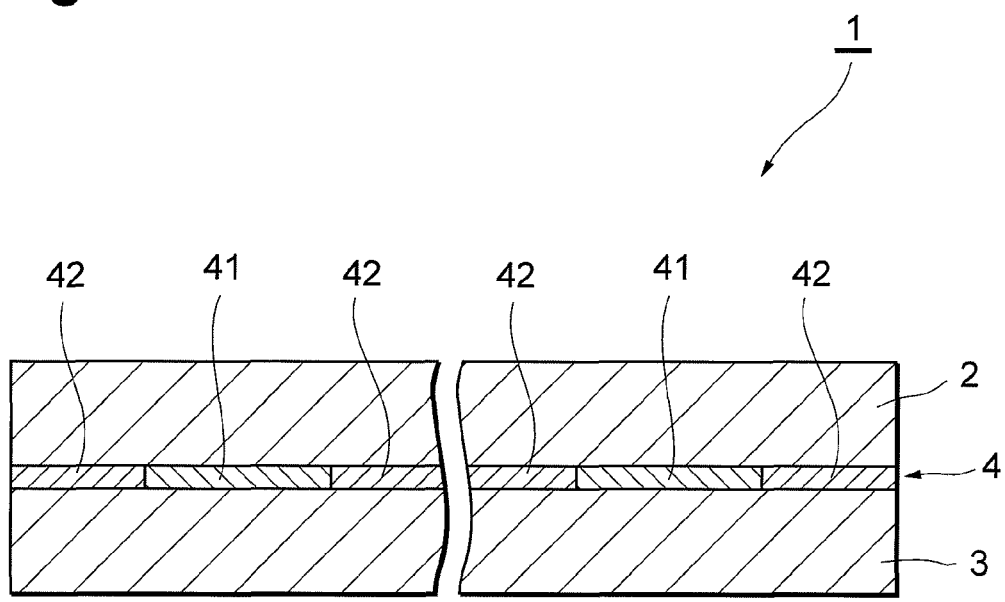
FIG. 2 is a partial sectional view along a line II-II in FIG. 1.

The robot hand 1 includes, as depicted in FIGS. 1 and 2, a carbon-fiber-reinforced plastic (hereinafter, referred to as "CFRP") layer 2 and a CFRP layer 3 that are laminated to each other and a vibration-damping elastic layer 4 disposed between the CFRP layer 2 and the CFRP layer 3. The attachment portion B is configured with one end portions of the CFRP layers 2 and 3 and the vibration-damping elastic layer 4.

The CFRP layers 2 and 3 are formed in a shape of approximately V-shaped elongated plate. More specifically, the CFRP layer 2 (CFRP layer 3) is configured with two trapezoidal plate-like pawl portions 21 (pawl portions 31) and a rectangular plate-like connection portion 22 (connection portion 32) connecting these pawl portions 21 (pawl portions 31). Each of these CFRP layers 2 and 3 includes a plurality of carbon fiber layers in each of which carbon fibers are oriented in a predetermined direction, and is manufactured, for example, by laminating a plurality of carbon fiber prepregs each of which is formed by impregnating each of the carbon fiber layers with a matrix resin (e.g., an epoxy resin) and thermally curing the laminated carbon fiber prepregs.

As the carbon fiber prepregs, for example, a GRANOC prepreg (pitch-based carbon fiber GRANOC XN-60 (tensile modulus: 620 GPa, carbon fiber areal weight: 125 g/m$^2$, matrix resin content: 32 wt %, thickness per layer: 0.11 mm) manufactured by Nippon Graphite Fiber Corporation), a GRANOC prepreg (pitch-based carbon fiber GRANOC XN-80 (tensile modulus: 780 GPa, carbon fiber areal weight: 125 g/m$^2$, matrix resin content: 32 wt %, thickness per layer: 0.11 mm) manufactured by Nippon Graphite Fiber Corporation), a GRANOC prepreg (pitch-based carbon fiber GRANOC XN-90 (tensile modulus: 860 GPa, carbon fiber areal weight: 125 g/m$^2$, matrix resin content: 32 wt %, thickness per layer: 0.105 mm) manufactured by Nippon Graphite Fiber Corporation), a carbon fiber prepreg (Y24N33C269 prepreg, PAN-based carbon fiber T700S, carbon fiber tensile modulus: 230 GPa, carbon fiber areal weight: 269 g/m$^2$, matrix resin content: 33.4 wt %, thickness per layer: 0.26 mm) manufactured by Nippon Oil Corporation), and the like can be used.

The vibration-damping elastic layer 4 has two viscoelastic resin regions 41 including a viscoelastic resin and three high-rigidity resin regions 42 including a high-rigidity resin that has higher rigidity than that of the viscoelastic resin. The viscoelastic resin regions 41, each of which is a rectangular parallelepiped region extending from one end of the CFRP layer 2 (CFRP layer 3) to a tip of each of the pawl portions 21 (pawl portions 31), are separate from and approximately parallel to each other. The high-rigidity resin regions 42 each are disposed on both sides of each of the viscoelastic resin regions 41. In other words, the viscoelastic resin regions 41 and the high-rigidity resin regions 42 are alternately arranged along a direction intersecting a longitudinal direction of the CFRP layers 2 and 3 over the entire length of the robot hand 1.

The viscoelastic resin constituting the viscoelastic resin regions 41 can be a resin that has lower rigidity than that of a matrix resin constituting the CFRP layers 2 and 3 and is made of viscoelastic material (flexible resin material) such as rubber and elastomer. The storage elastic modulus at 25° C. of the viscoelastic material is preferred to be within a range of 0.1 MPa or more and 2500 MPa or less, further preferred to be within a range of 0.1 MPa or more and 250 MPa or less, and still further preferred to be within a range of 0.1 MPa or more and 25 MPa or less. When the storage elastic modulus of the viscoelastic material is equal to or lower than 2500 MPa, sufficient vibration-damping properties can be obtained and, when it is equal to or higher than 0.1 MPa, decrease in rigidity of the robot hand 1 is small, and thus performance required for industrial parts can be achieved. In addition, as the CFRP layers 2 and 3 are manufactured from carbon fiber prepregs by heat curing, the viscoelastic material is preferred to be stable against the heat generated during the heat curing. Furthermore, the viscoelastic material is preferred to be a material that is excellent in an adhesive property to the matrix resin of the CFRP layers 2 and 3.

In view of the foregoing, the viscoelastic material constituting the viscoelastic resin regions 41 can be a material that is more flexible than the CFRP layers 2 and 3, examples of which include a rubber such as a styrene-butadiene rubber (SBR), a chloroprene rubber (CR), an isobutylene-isoprene rubber (IIR), a nitrile-butadiene rubber (NBR), and an ethylene-propylene rubber (EPM, EPDM), a polyester resin, a vinylester resin, a polyurethane resin, and an epoxy resin whose elastic modulus is reduced by adding a rubber, an elastomer, or the like that is a polymer having a flexible chain.

Meanwhile, the high-rigidity resin constituting the high-rigidity resin regions 42 can be an epoxy resin, for example, and is particularly preferred to be the same as the matrix resin of the CFRP layers 2 and 3. In this case, when integrally molding the CFRP layers 2 and 3 and the vibration-damping elastic layer 4, the high-rigidity resin regions 42 are easily formed integrally with the CFRP layers 2 and 3 due to the matrix resin of the CFRP layers 2 and 3.

In the robot hand 1 described above, when it is incorporated into the robot, the attachment portion B is held. In this case, as the vibration-damping elastic layer 4 having the viscoelastic resin regions 41 including the viscoelastic resin is disposed between the CFRP layer 2 and the CFRP layer 3, vibration-damping properties are improved. In addition, because the viscoelastic resin regions 41 and the high-rigidity resin regions 42 having relatively higher rigidity are alternately arranged along the direction intersecting the longitudinal direction of the CFRP layers 2 and 3 in the attachment portion B, flexural rigidity along the longitudinal direction of the CFRP layers 2 and 3 is secured. Therefore, with the robot hand 1, when the attachment portion B is held and a glass substrate, a semiconductor substrate, or the like is placed on the main portion A, it is possible to quickly damp vibrations while preferably maintaining its shape by a certain degree of flexural rigidity.

Second Embodiment

Figure 3:
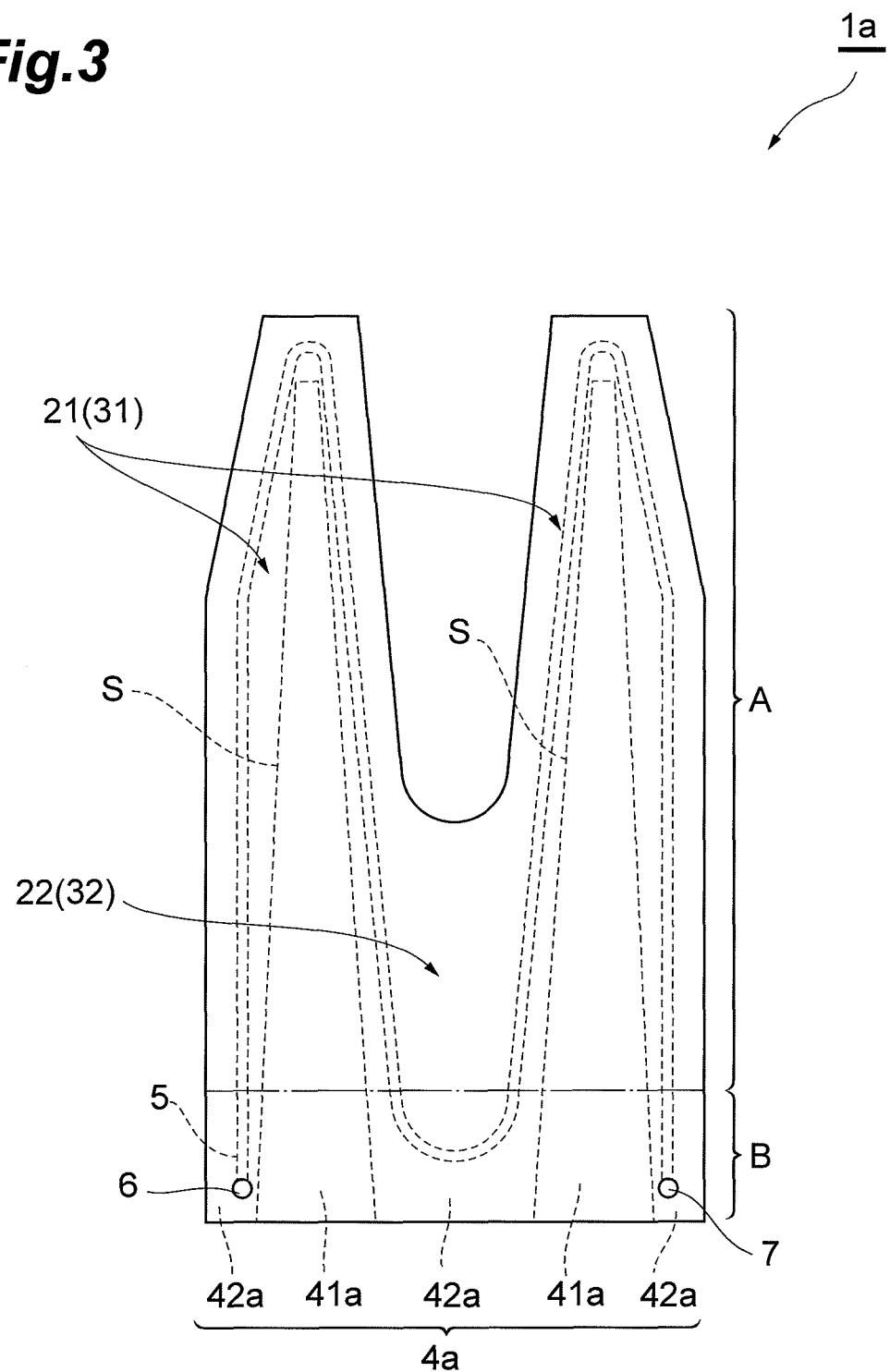
FIG. 3 is a plan view of a second embodiment of the robot hand according to the present invention.

As depicted in FIG. 3, a robot hand 1a includes a vibration-damping elastic layer 4a in place of the vibration-damping elastic layer 4 of the robot hand 1 according to the first embodiment. The vibration-damping elastic layer 4a has two viscoelastic resin regions 41a including a viscoelastic resin and a high-rigidity resin region 42a including a high-rigidity resin that has higher rigidity than that of the viscoelastic resin.

The viscoelastic resin regions 41a, each of which is a trapezoidal plate-like region extending from the one end of the CFRP layer 2 (CFRP layer 3) to the vicinity of the tip of each of the pawl portions 21 (pawl portions 31), are separated from each other. The high-rigidity resin region 42a is disposed in a manner surrounding these viscoelastic resin regions 41a. The viscoelastic resin regions 41a and the high-rigidity resin region 42a are alternately arranged along the direction intersecting the longitudinal direction of the CFRP layers 2 and 3 at least in the attachment portion B.

Note that the viscoelastic resin regions 41a and the high-rigidity resin region 42a can be ones including materials similar to those of the viscoelastic resin regions 41 and the high-rigidity resin regions 42 according to the first embodiment, respectively.

Herein, to the high-rigidity resin region 42a, a flow path (heat-transfer medium flow path) 5 for circulating therethrough a coolant (heat-transfer medium) such as cooling water or cooling gas is provided along outer borders S of the two viscoelastic resin regions 41a. In addition, at a position corresponding to the starting end of the flow path 5 in the CFRP layer 2 (CFRP layer 3), an inlet 6 for introducing the coolant therethrough into the flow path 5 is provided and, at a position corresponding to the ending end of the flow path 5 in the CFRP layer 2 (CFRP layer 3), an outlet 7 for discharging the coolant therethrough is provided.

In the robot hand 1a described above also, when it is incorporated into the robot, the attachment portion B is held. In this case, as the vibration-damping elastic layer 4a having the viscoelastic resin regions 41a including the viscoelastic resin is disposed between the CFRP layer 2 and the CFRP layer 3, vibration-damping properties are improved. In addition, as the viscoelastic resin regions 41a and the high-rigidity resin region 42a having relatively higher rigidity are alternately arranged along the direction intersecting the longitudinal direction of the CFRP layers 2 and 3 in the attachment portion B, flexural rigidity along the longitudinal direction of the CFRP layers 2 and 3 is secured. Furthermore, in the robot hand 1a, by circulating a coolant through the flow path 5 provided to the high-rigidity resin region 42a, the robot hand 1a can be preferably cooled. Particularly as the flow path 5 is provided along the outer borders S of the viscoelastic resin regions 41a, the viscoelastic resin regions 41a can be efficiently cooled.

Note that the heat-transfer medium circulated through the flow path 5 is not limited to the coolant, and can be a heat-transfer medium for heating the robot hand 1a and the viscoelastic resin regions 41a. Therefore, by appropriately changing the heat-transfer medium circulated through the flow path 5 to one for cooling or one for heating, it is possible to preferably adjust temperature of the robot hand 1a and the viscoelastic resin regions 41a.

The vibration-damping elastic layer 4 and the vibration-damping elastic layer 4a according to the first and the second embodiments described above can be configured in aspects described below, for example.

Figure 4:
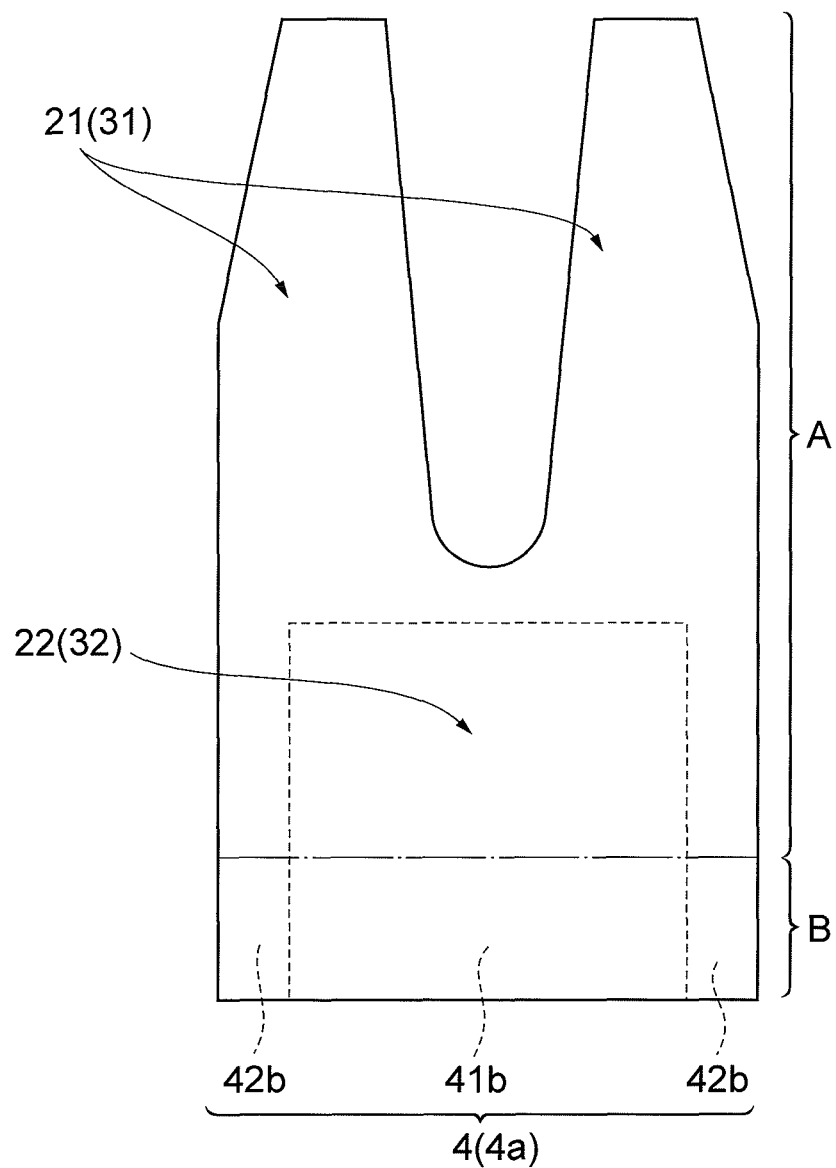
FIG. 4 is a plan view illustrating another aspect of a vibration-damping elastic layer depicted in FIG. 1 and FIG. 3.

More specifically, as depicted in FIG. 4, the vibration-damping elastic layers 4 and 4a can be ones that have a single viscoelastic resin region 41b that is disposed on the connection portion 22 (connection portion 32) of the CFRP layer 2 (CFRP layer 3) and is square-like in a planar view and a high-rigidity resin region 42b that is disposed in a manner surrounding this viscoelastic resin region 41b. In this case, the viscoelastic resin region 41b and the high-rigidity resin region 42b are alternately arranged (herein, in the order of the high-rigidity resin region 42b, the viscoelastic resin region 41b, and the high-rigidity resin region 42b) along the direction intersecting the longitudinal direction of the CFRP layers 2 and 3 at least in the attachment portion B.

Figure 5:
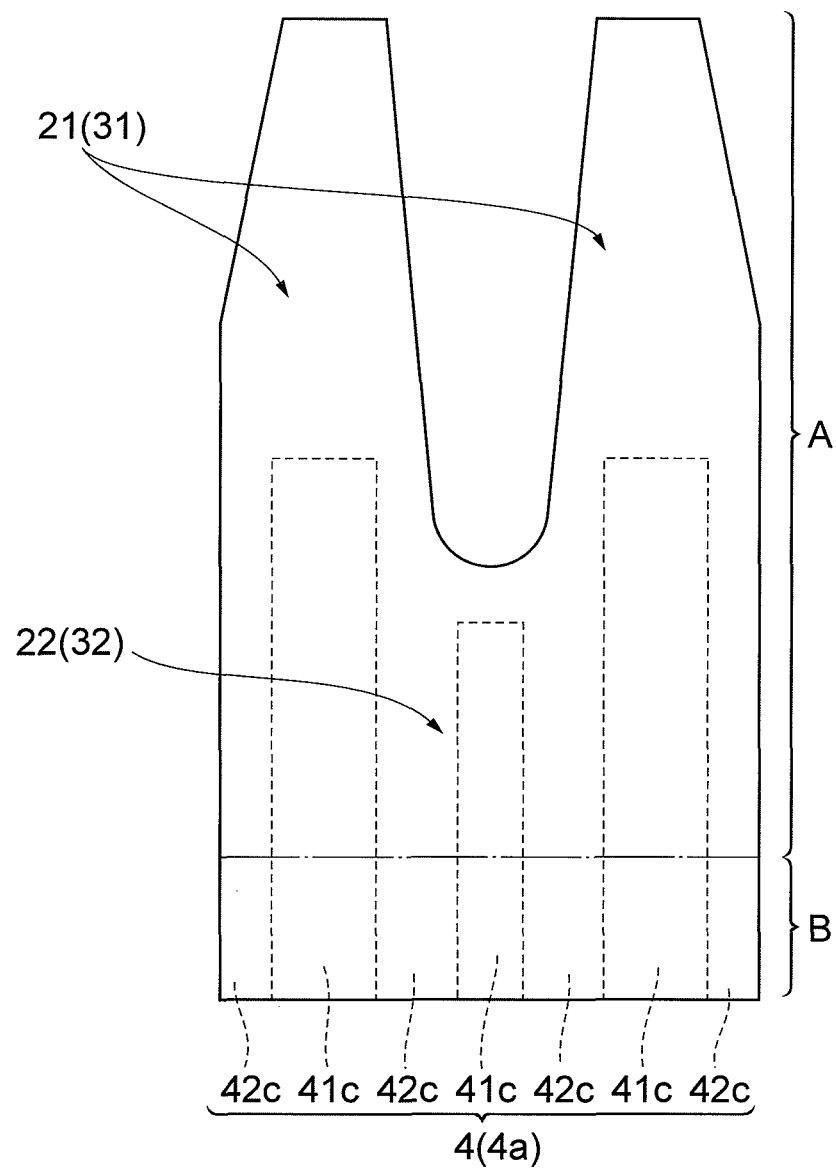
FIG. 5 is a plan view illustrating still another aspect of the vibration-damping elastic layer depicted in FIG. 1 and FIG. 3.

In addition, as depicted in FIG. 5, the vibration-damping elastic layers 4 and 4a can be ones that have three viscoelastic resin regions 41c that are disposed separately from each other and a high-rigidity resin region 42c that is disposed in a manner surrounding these viscoelastic resin regions 41c. The viscoelastic resin regions 41c, each of which is a rectangular parallelepiped region extending from one end of the CFRP layer 2 (CFRP layer 3) along the longitudinal direction of the CFRP layers 2 and 3, are approximately parallel to each other. In this case, the viscoelastic resin regions 41c and the high-rigidity resin region 42c are alternately arranged along the direction intersecting the longitudinal direction of the CFRP layers 2 and 3 at least in the attachment portion B.

Note that a material constituting each of the viscoelastic resin regions 41b and 41c is similar to the material constituting the viscoelastic resin regions 41 according to the first embodiment. In addition, a high-rigidity resin constituting each of the high-rigidity resin regions 42b and 42c is similar to the high-rigidity resin constituting the high-rigidity resin regions 42 according to the first embodiment.

Third Embodiment

As depicted in FIG. 6, a robot hand 1d includes the main portion A and the attachment portion B that is provided in a manner extending from one end of the main portion A and is held when the robot hand 1d is incorporated into a robot. This robot hand 1d also can be applied to an industrial robot for conveying glass substrates or semiconductor substrates, for example. In this case, the robot hand 1d is fixed on the industrial robot via the attachment portion B, and an object to be conveyed such as a glass substrate or a semiconductor substrate is placed on the main portion A.

The robot hand 1d includes a CFRP layer 2d that is in a shape of elongated tube having a rectangular cross section, a CFRP layer 3d that is laminated on the CFRP layer 2d and is in a shape of elongated tube having a rectangular cross section, and a vibration-damping elastic layer 4d disposed between the CFRP layer 2d and the CFRP layer 3d. The attachment portion B is configured with one end portions of these CFRP layers 2d and 3d and the vibration-damping elastic layer 4d. The CFRP layers 2d and 3d are manufactured by winding carbon fiber prepregs each of which is formed by impregnating a carbon fiber layer with a matrix resin (e.g., an epoxy resin) around a cored bar of aluminum or the like to laminate them and thermally curing them.

The vibration-damping elastic layer 4d has a single viscoelastic resin region 41d including a viscoelastic resin and a high-rigidity resin region 42d including a high-rigidity resin that has higher rigidity than that of the viscoelastic resin. The viscoelastic resin region 41d is a trapezoidal plate-like region extending from one ends to the other ends of the CFRP layers 2d and 3d, and is disposed on one side of the CFRP layer 2d. The high-rigidity resin region 42d is disposed on both sides of the viscoelastic resin region 41d. The viscoelastic resin region 41d and the high-rigidity resin region 42d are alternately arranged (herein, in the order of the high-rigidity resin region 42d, the viscoelastic resin region 41d, and the high-rigidity resin region 42d) along the direction intersecting the longitudinal direction of the CFRP layers 2d and 3d over the entire length of the robot hand 1d.

Note that the viscoelastic resin region 41d and the high-rigidity resin region 42d can be ones including materials similar to those of the viscoelastic resin regions 41 and the high-rigidity resin regions 42 according to the first embodiment, respectively.

In the robot hand 1d described above also, when it is incorporated into the robot, the attachment portion B is held. In this case, as the vibration-damping elastic layer 4d having the viscoelastic resin region 41d including the viscoelastic resin is disposed between the CFRP layer 2d and the CFRP layer 3d, vibration-damping properties are improved. In addition, as the viscoelastic resin region 41d and the high-rigidity resin region 42d having relatively high rigidity are alternately arranged along the direction intersecting the longitudinal direction of the CFRP layers 2d and 3d in the attachment portion B, flexural rigidity along the longitudinal direction of the CFRP layers 2 and 3 is secured.

Alternatively, the vibration-damping elastic layer 4d can be, as depicted in FIG. 7, for example, one that has two viscoelastic resin regions 41f that are disposed on one side of the CFRP layer 2d and separated from each other and high-rigidity resin regions 42f that are disposed on both sides of each of the viscoelastic resin regions 41f. These viscoelastic resin regions 41f, each of which is a rectangular parallelepiped region extending from one ends to the other ends of the CFRP layers 2d and 3d, are approximately parallel to each other. In this case also, the viscoelastic resin regions 41f and the high-rigidity resin regions 42f are alternately arranged along the direction intersecting the longitudinal direction of the CFRP layers 2d and 3d over the entire length of the robot hand 1d.

Note that the viscoelastic resin regions 41f and the high-rigidity resin regions 42f include materials similar to those of the viscoelastic resin regions 41 and the high-rigidity resin regions 42 according to the first embodiment, respectively.

Herein, the viscoelastic resin regions 41d and 41f described above may be disposed on a plurality of sides of the CFRP layer 2d, without being limited to the one side of the CFRP layer 2d. For example, the viscoelastic resin regions 41d and 41f can be disposed on an upper surface of the CFRP layer 2d and on a lower surface opposed to the upper surface thereof. Herein, the upper surface and the lower surface of the CFRP layer 2d are surfaces extending along the direction intersecting a vibration direction of the robot hand 1d. Furthermore, the viscoelastic resin regions 41d and 41f can be disposed on other two sides of the CFRP layer 2d in addition to on the upper surface and the lower surface of the CFRP layer 2d. When the viscoelastic resin regions 41d and 41f are disposed on a plurality of sides of the CFRP layer 2d in this manner, vibration-damping properties can be further improved.

Fourth Embodiment

Figure 8:
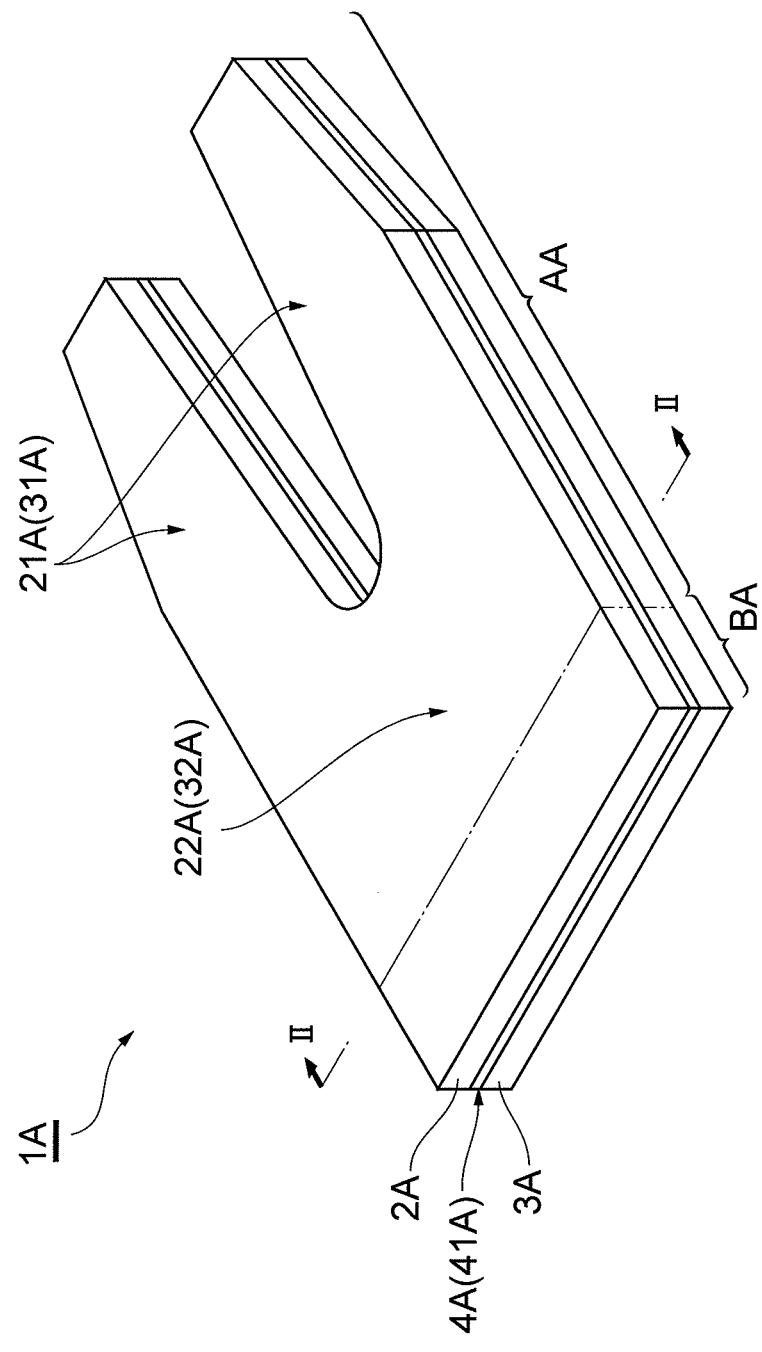
FIG. 8 is a perspective view of a fourth embodiment of the robot hand according to the present invention.

As depicted in FIG. 8, a robot hand 1A includes a main portion AA and an attachment portion BA that is provided in a manner extending from one end of the main portion AA and is held when the robot hand 1A is incorporated into a robot. This robot hand 1A can be applied to an industrial robot for conveying glass substrates or semiconductor substrates, for example. In this case, the robot hand 1A is fixed on the industrial robot via the attachment portion BA, and an object to be conveyed such as a glass substrate or a semiconductor substrate is placed on the main portion AA.

Figure 9:
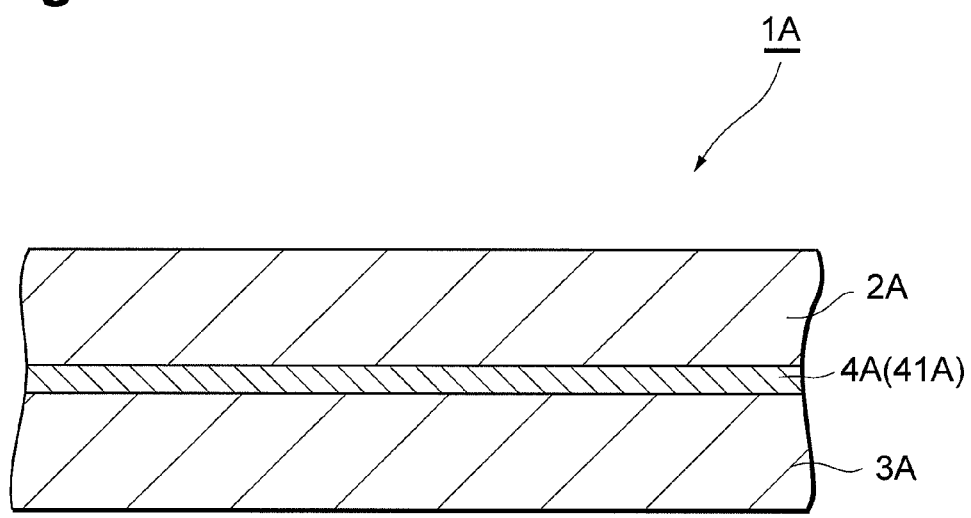
FIG. 9 is a partial sectional view along a line II-II in FIG. 8.

The robot hand 1A includes, as depicted in FIGS. 8 and 9, a CFRP layer 2A and a CFRP layer 3A that are laminated to each other and a vibration-damping elastic layer 4A disposed between the CFRP layer 2A and the CFRP layer 3A. The attachment portion BA is configured with one end portions of the CFRP layers 2A and 3A and the vibration-damping elastic layer 4A.

The CFRP layers 2A and 3A are formed in a shape of approximately V-shaped elongated plate. More specifically, the CFRP layer 2A (CFRP layer 3A) is configured with two trapezoidal plate-like pawl portions 21A (pawl portions 31A) and a rectangular plate-like connection portion 22A (connection portion 32A) connecting these pawl portions 21A (pawl portions 31A). Each of these CFRP layers 2A and 3A includes a plurality of carbon fiber layers in each of which carbon fibers are oriented in a predetermined direction, and is manufactured, for example, by laminating a plurality of carbon fiber prepregs each of which is formed by impregnating each of the carbon fiber layers with a matrix resin (e.g., an epoxy resin) and thermally curing the laminated carbon fiber prepregs.

As the carbon fiber prepregs, for example, a GRANOC prepreg (pitch-based carbon fiber GRANOC XN-60 (tensile modulus: 620 GPa, carbon fiber areal weight: 125 g/m$^2$, matrix resin content: 32 wt %, thickness per layer: 0.11 mm) manufactured by Nippon Graphite Fiber Corporation), a GRANOC prepreg (pitch-based carbon fiber GRANOC XN-80 (tensile modulus: 780 GPa, carbon fiber areal weight: 125 g/m$^2$, matrix resin content: 32 wt %, thickness per layer: 0.11 mm) manufactured by Nippon Graphite Fiber Corporation), a GRANOC prepreg (pitch-based carbon fiber GRANOC XN-90 (tensile modulus: 860 GPa, carbon fiber areal weight: 125 g/m$^2$, matrix resin content: 32 wt %, thickness per layer: 0.105 mm) manufactured by Nippon Graphite Fiber Corporation), a carbon fiber prepreg (Y24N33C269 prepreg, PAN-based carbon fiber T700S, carbon fiber tensile modulus: 230 GPa, carbon fiber areal weight: 269 g/m$^2$, matrix resin content: 33.4 wt %, thickness per layer: 0.26 mm) manufactured by Nippon Oil Corporation), and the like can be used.

The vibration-damping elastic layer 4A has a viscoelastic resin region 41A. The viscoelastic resin region 41A is disposed over the entire region between CFRP layer 2A and the CFRP layer 3A. The viscoelastic resin region 41A includes a material containing a viscoelastic resin and a fibrous substance kneaded with the viscoelastic resin.

The viscoelastic resin constituting the viscoelastic region 41A can be a resin that has lower rigidity than that of a matrix resin constituting the CFRP layers 2A and 3A and is made of a viscoelastic material (flexible resin material) such as rubber and elastomer. The storage elastic modulus at 25° C. of the viscoelastic material is preferred to be within a range of 0.1 MPa or more and 2500 MPa or less, further preferred to be within a range of 0.1 MPa or more and 250 MPa or less, and still further preferred to be within a range of 0.1 MPa or more and 25 MPa or less. When the storage elastic modulus of the viscoelastic material is equal to or lower than 2500 MPa, sufficient vibration-damping properties can be obtained and, when it is equal to or higher than 0.1 MPa, decrease in rigidity of the robot hand 1A is small, and thus performance required for industrial parts can be achieved. In addition, as the CFRP layers 2A and 3A are manufactured from carbon fiber prepregs by heat curing, the viscoelastic material is preferred to be stable against the heat generated during the heat curing. Furthermore, the viscoelastic material is preferred to be a material that is excellent in an adhesive property to the matrix resin of the CFRP layers 2A and 3A.

In view of the foregoing, the viscoelastic material constituting viscoelastic resin region 41A can be a material that is more flexible than the CFRP, examples of which include a rubber such as a styrene-butadiene rubber (SBR), a chloroprene rubber (CR), an isobutylene-isoprene rubber (IIR), a nitrile-butadiene rubber (NBR), and an ethylene-propylene rubber (EPM, EPDM), a polyester resin, a vinylester resin, a polyurethane resin, and an epoxy resin whose elastic modulus is reduced by adding a rubber, an elastomer, or the like that is a polymer having a flexible chain.

The fibrous substance can be one that has higher rigidity than that of this viscoelastic resin and is at least one out of carbon nanotube, Ketjenblack, short glass fiber, and short carbon fiber. The carbon nanotube can be one that has a Young's modulus in the longitudinal direction of fibers thereof within a range of 500 GPa or more and 10000 GPa or less, for example. The short glass fiber can be one that has a Young's modulus in the longitudinal direction of fibers thereof within a range of 60 GPa or more and 90 GPa or less, for example. The short carbon fiber can be one that has a Young's modulus in the longitudinal direction of fibers thereof within a range of 50 GPa or more and 1000 GPa or less, for example.

The length of each of these fibrous substances can be within a range of 1 μm or more and 6 mm or less. When the length of the fibrous substance is equal to or longer than 1 μm, shear force that the fibrous substance exerts on the viscoelastic resin becomes relatively larger, which improves the rigidity of the robot hand 1A and, when it is equal to or shorter than 6 mm, the storage elastic modulus of the vibration-damping elastic layer 4A does not become excessively high, and thus sufficient vibration-damping properties can be obtained. In addition, the aspect ratio of the length of the fibrous substance divided by the diameter of the fibrous substance is preferred to be within a range of 5 or more and 600 or less, and further preferred to be within a range of 5 or more and 300 or less. When the aspect ratio is equal to or higher than 5, entanglement between fibrous substances becomes more likely to occur, and accordingly the rigidity of the robot hand 1A can be improved and, when it is equal to or lower than 600, the fibrous substance can be dispersed in a comparatively uniform manner in kneading the fibrous substance with the viscoelastic resin.

In addition, the mixing ratio of the fibrous substance to the viscoelastic resin can be set within a range of 0.1 wt % or more and 30 wt % or less. When the mixing ratio of the fibrous substance to the viscoelastic resin is equal to or higher than 0.1 wt %, the effect on rigidity improvement of the robot hand 1A is relatively large and, when it is equal to or lower than 30 wt %, sufficient vibration-damping properties can be obtained.

This vibration-damping elastic layer 4A is manufactured, for example, by after adding the fibrous substance to a solution of the viscoelastic resin and stirring them, pouring this mixture into a sheet-shaped mold and drying it, and heating and pressing the resulting mixture by a hot-pressing apparatus.

In the robot hand 1A described above, when it is incorporated into a robot, the attachment portion BA is held. In this case, between the CFRP layer 2A and the CFRP layer 3A, the vibration-damping elastic layer 4A having the viscoelastic resin region 41A including the material containing the viscoelastic resin and the fibrous substance that is kneaded with the viscoelastic resin and has relatively higher rigidity is disposed, which makes it possible to improve vibration-damping properties while maintaining flexural rigidity. Therefore, with the robot hand 1A, when the attachment portion BA is held and a glass substrate, a semiconductor substrate, or the like is placed on the main portion AA, it is possible to quickly damp vibrations while preferably maintaining its shape by a certain degree of flexural rigidity.

Fifth Embodiment

Figure 10:
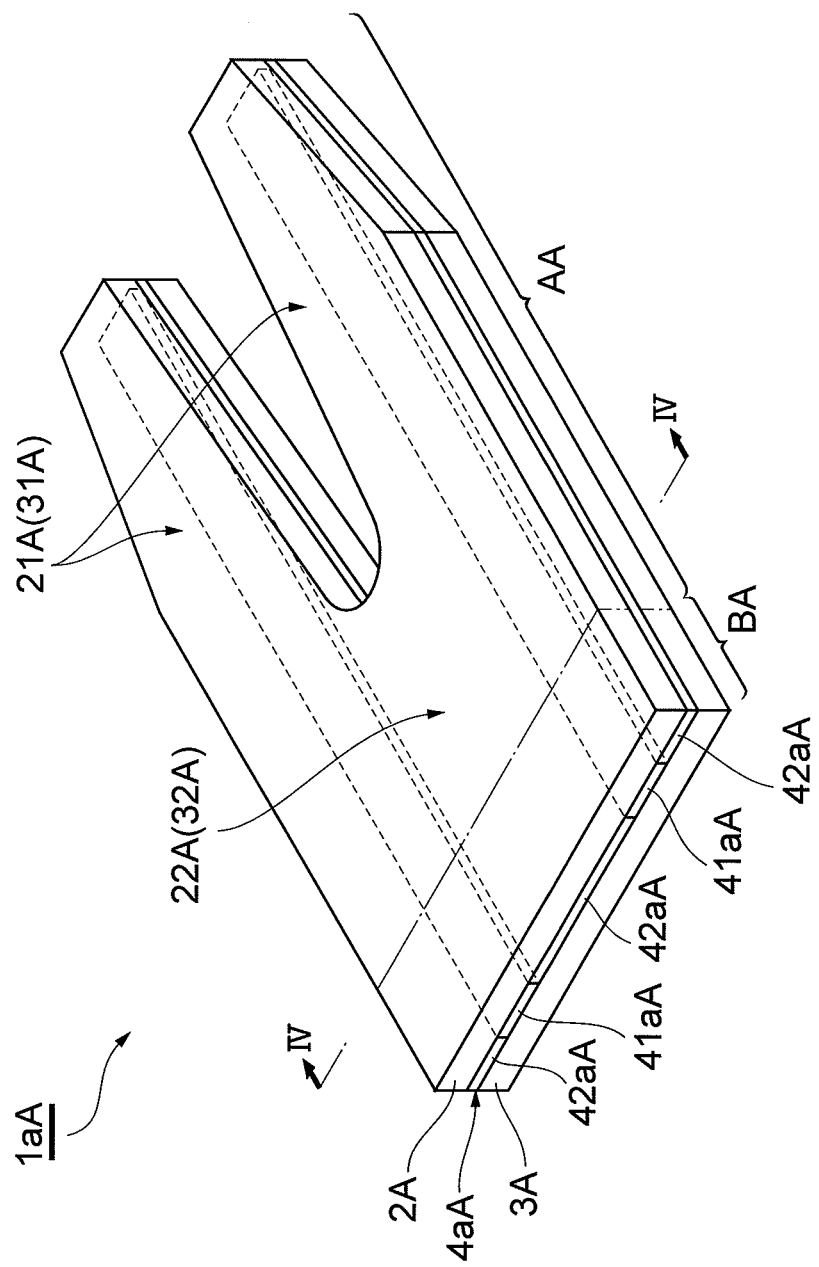
FIG. 10 is a perspective view of a fifth embodiment of the robot hand according to the present invention.
Figure 11:
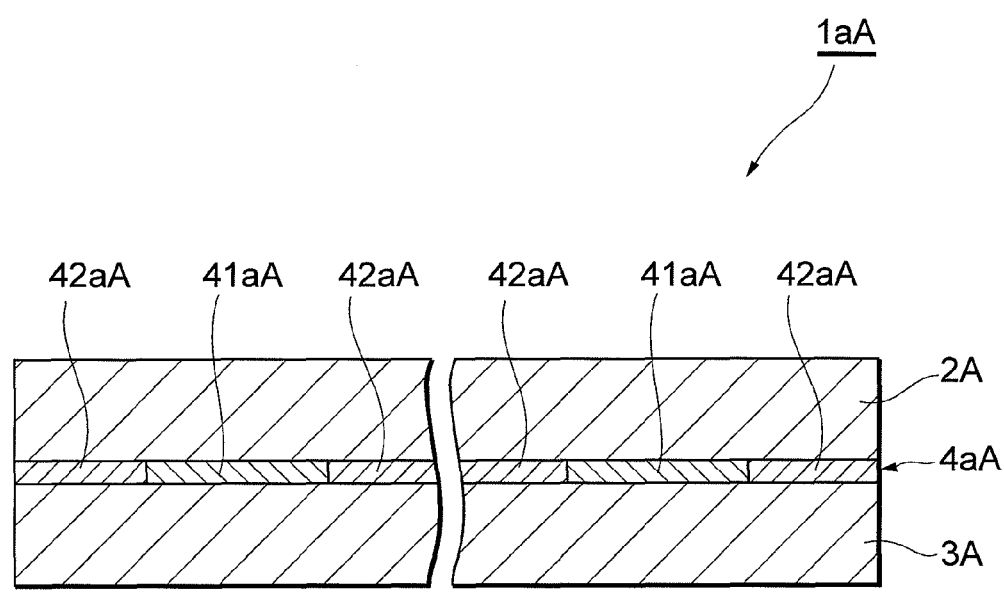
FIG. 11 is a partial sectional view along a line IV-IV in FIG. 10.

As depicted in FIGS. 10 and 11, a robot hand 1aA differs from the robot hand 1A according to the fourth embodiment in including a vibration-damping elastic layer 4aA in place of the vibration-damping elastic layer 4A. The vibration-damping elastic layer 4aA has two viscoelastic resin regions 41aA including a material containing a viscoelastic resin and a fibrous substance kneaded with the viscoelastic resin and three high-rigidity resin regions 42aA including a high-rigidity resin that has higher rigidity than that of the viscoelastic resin.

The viscoelastic resin regions 41aA, each of which is a rectangular parallelepiped region extending from one end of the CFRP layer 2A (CFRP 3A) to a tip of each of the pawl portions 21A (pawl portions 31A), are separate from and approximately parallel to each other. The high-rigidity resin regions 42aA each are disposed on both sides of each of the viscoelastic resin regions 41aA. In other words, the viscoelastic resin regions 41aA and the high-rigidity resin regions 42aA are alternately arranged along a direction intersecting a longitudinal direction of the CFRP layers 2A and 3A over the entire length of the robot hand 1aA.

Note that the material constituting of the viscoelastic resin regions 41aA can be one that is similar to the material constituting the viscoelastic resin region 41A according to the fourth embodiment. Meanwhile, the high-rigidity resin constituting of the high-rigidity resin regions 42aA can be an epoxy resin, for example, and is particularly preferred to be the same as the matrix resin of the CFRP layers 2A and 3A. In this case, when integrally molding the CFRP layers 2A and 3A and the vibration-damping elastic layer 4aA, the high-rigidity resin regions 42aA are easily formed integrally with the CFRP layers 2A and 3A due to the matrix resin of the CFRP layers 2A and 3A.

In the robot hand 1aA described above also, when it is incorporated into the robot, the attachment portion BA is held. In this case, between the CFRP layer 2A and the CFRP layer 3A, the vibration-damping elastic layer 4aA having the viscoelastic resin regions 41aA including the material containing the viscoelastic resin and the fibrous substance that is kneaded with the viscoelastic resin and has relatively higher rigidity is disposed, which makes it possible to improve vibration-damping properties while maintaining flexural rigidity. In addition, as the viscoelastic resin regions 41aA and the high-rigidity resin regions 42aA having relatively higher rigidity are alternately arranged along the direction intersecting the longitudinal direction of the CFRP layers 2A and 3A in the attachment portion BA, flexural rigidity along the longitudinal direction of the CFRP layers 2A and 3A is improved.

Sixth Embodiment

Figure 12:
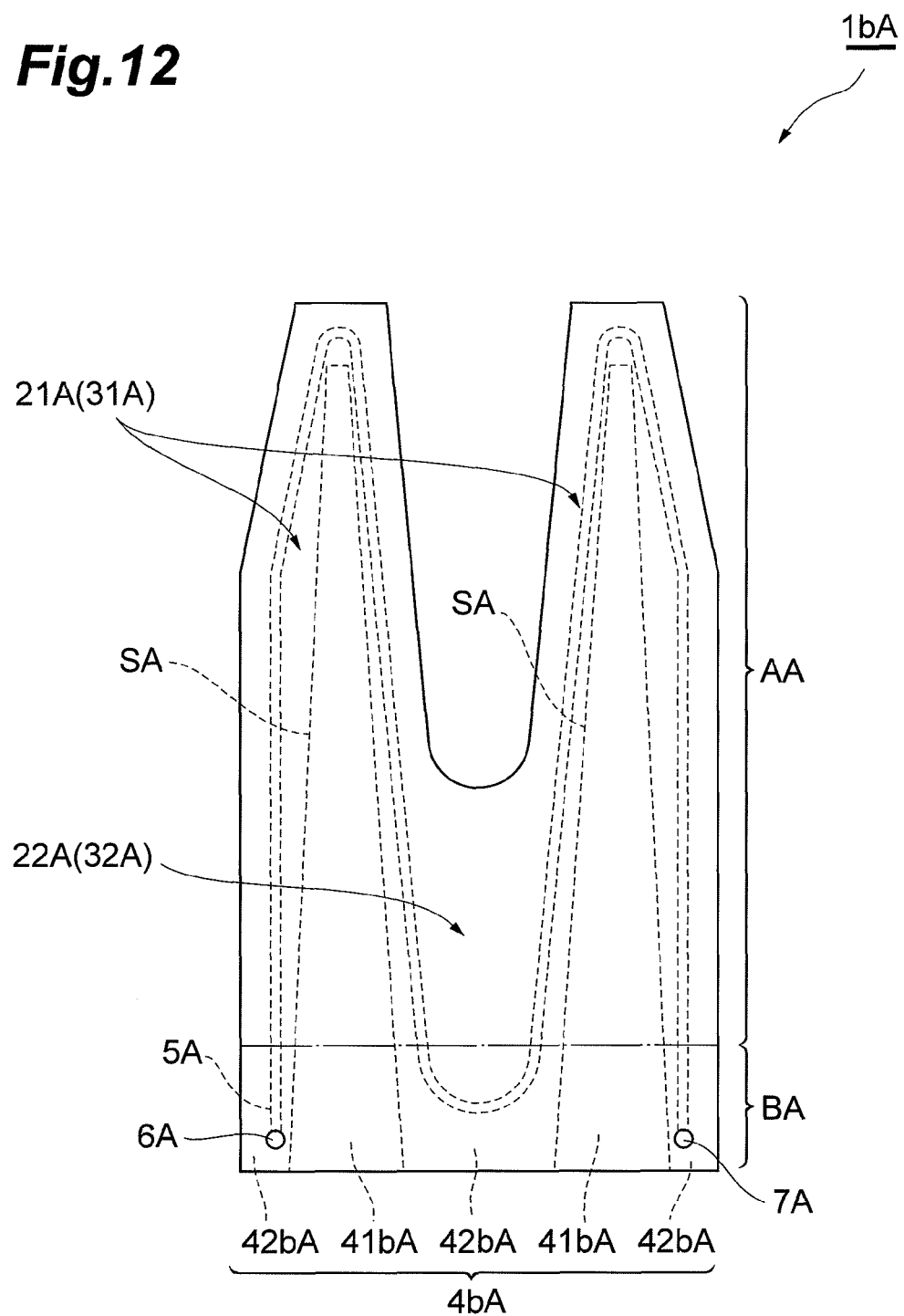
FIG. 12 is a plan view of a sixth embodiment of the robot hand according to the present invention.

As depicted in FIG. 12, a robot hand 1bA includes a vibration-damping elastic layer 4bA in place of the vibration-damping elastic layer 4aA of the robot hand 1aA according to the fifth embodiment. The vibration-damping elastic layer 4bA has two viscoelastic resin regions 41bA including a viscoelastic resin and a high-rigidity resin region 42bA including a high-rigidity resin that has higher rigidity than that of the viscoelastic resin of the viscoelastic resin regions 41bA.

The viscoelastic resin regions 41bA, each of which is a trapezoidal plate-like region extending from the one end of the CFRP layer 2A (CFRP layer 3A) to the vicinity of the tip of each of the pawl portions 21A (pawl portions 31A), are separated from each other. The high-rigidity resin region 42bA is disposed in a manner surrounding these viscoelastic resin regions 41bA. The viscoelastic resin regions 41bA and the high-rigidity resin region 42bA are alternately arranged along the direction intersecting the longitudinal direction of the CFRP layers 2A and 3A at least in the attachment portion BA.

Note that a material constituting the viscoelastic resin regions 41bA can be one similar to the material constituting the viscoelastic resin region 41A according to the fourth embodiment. In addition, the high-rigidity resin constituting the high-rigidity resin region 42bA can be one similar to the high-rigidity resin constituting the high-rigidity resin regions 42aA according to the fifth embodiment.

Herein, to the high-rigidity resin region 42bA, a flow path (heat-transfer medium flow path) 5A for circulating therethrough a coolant (heat-transfer medium) such as cooling water or cooling gas is provided along outer borders SA of the two viscoelastic resin regions 41bA. In addition, at a position corresponding to the starting end of the flow path 5A in the CFRP layer 2A (CFRP layer 3A), an inlet 6A for introducing the coolant therethrough into the flow path 5A is provided and, at a position corresponding to the ending end of the flow path 5A in the CFRP layer 2A (CFRP layer 3A), an outlet 7A for discharging the coolant therethrough is provided.

In the robot hand 1bA described above also, when it is incorporated into the robot, the attachment portion BA is held. In this case, between the CFRP layer 2A and the CFRP layer 3A, the vibration-damping elastic layer 4bA having the viscoelastic resin regions 41bA including the material containing the viscoelastic resin and the fibrous substance that is kneaded with the viscoelastic resin and has relatively higher rigidity is disposed, which makes it possible to improve vibration-damping properties while maintaining flexural rigidity. In addition, because the viscoelastic resin regions 41bA and the high-rigidity resin region 42bA having relatively higher rigidity are alternately arranged along the direction intersecting the longitudinal direction of the CFRP layers 2A and 3A in the attachment portion BA, flexural rigidity along the longitudinal direction of the CFRP layers 2A and 3A is improved. Furthermore, in the robot hand 1bA, by circulating a coolant through the flow path 5A provided to the high-rigidity resin region 42bA, the robot hand 1bA can be preferably cooled. Particularly because the flow path 5A is provided along the outer borders SA of the viscoelastic resin regions 41bA, the viscoelastic resin regions 41bA can be efficiently cooled.

Note that the heat-transfer medium circulated through the flow path 5A is not limited to the coolant, and can be a heat-transfer medium for heating the robot hand 1bA and the viscoelastic resin regions 41bA. Therefore, by appropriately changing the heat-transfer medium circulated through the flow path 5A to one for cooling or one for heating, it is possible to preferably adjust temperature of the robot hand 1bA and the viscoelastic resin regions 41bA.

The vibration-damping elastic layer 4aA and the vibration-damping elastic layer 4bA according to the fifth and the sixth embodiments described above can be configured in aspects described below, for example.

Figure 13:
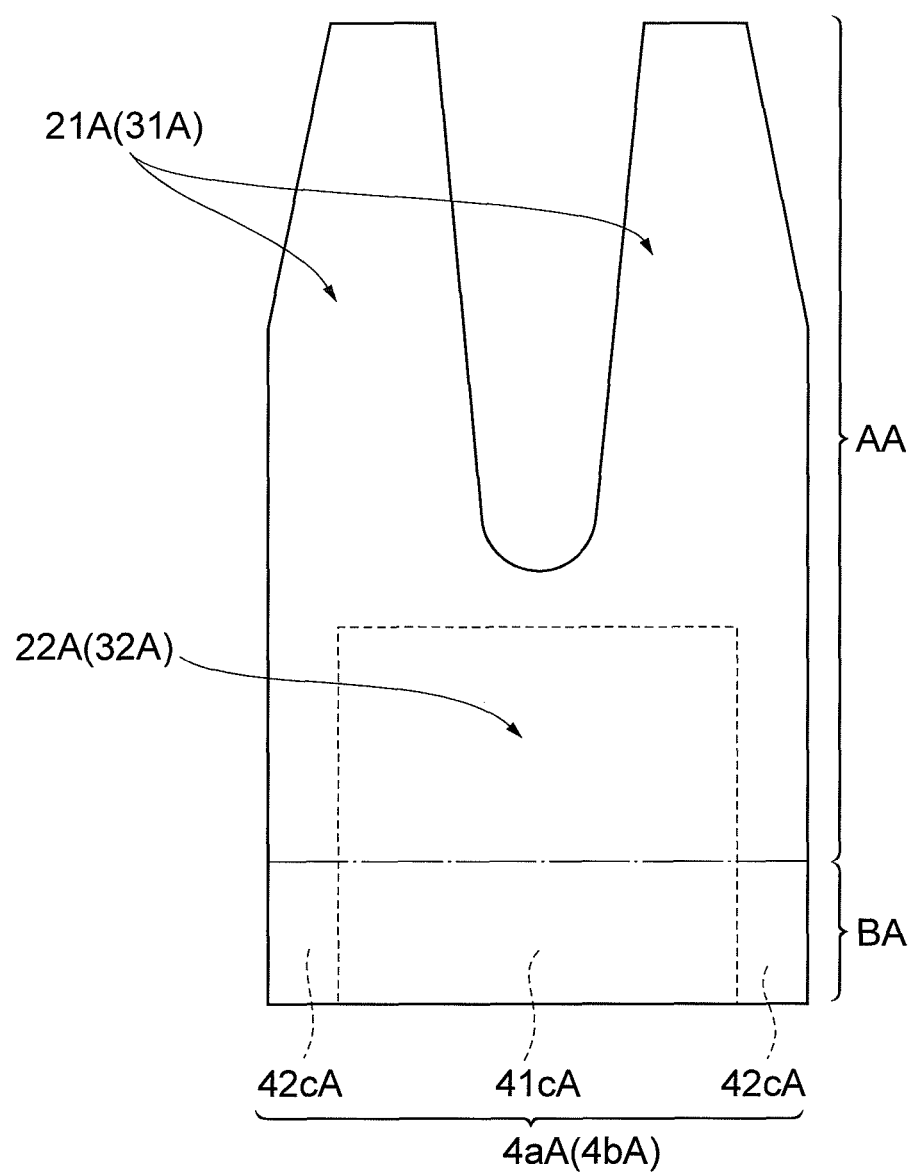
FIG. 13 is a plan view illustrating another aspect of a vibration-damping elastic layer depicted in FIG. 10 and FIG. 12.

More specifically, as depicted in FIG. 13, the vibration-damping elastic layers 4aA and 4bA can be ones that have a single viscoelastic resin region 41cA that is disposed on the connection portion 22A (connection portion 32A) of the CFRP layer 2A (CFRP layer 3A) and is square-like in a planar view and a high-rigidity resin region 42cA that is disposed in a manner surrounding this viscoelastic resin region 41cA. In this case also, the viscoelastic resin region 41cA and the high-rigidity resin region 42cA are alternately arranged (herein, in the order of the high-rigidity resin region 42cA, the viscoelastic resin region 41cA, and the high-rigidity resin region 42cA) along the direction intersecting the longitudinal direction of the CFRP layers 2A and 3A at least in the attachment portion BA.

Figure 14:
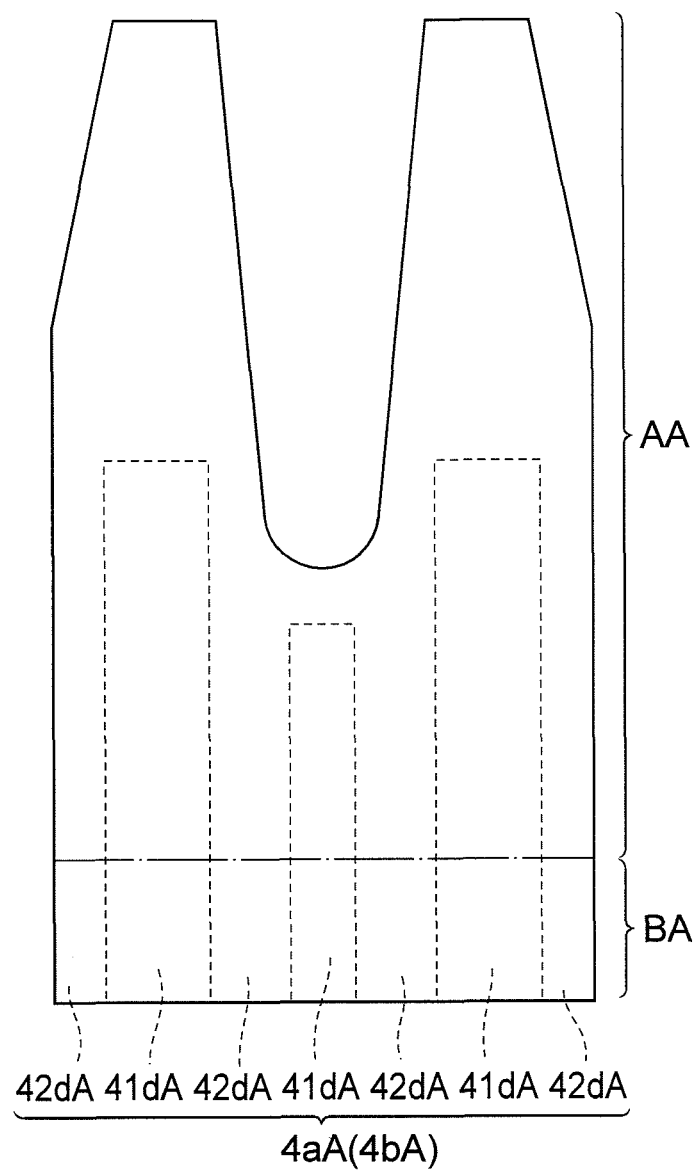
FIG. 14 is a plan view illustrating still another aspect of the vibration-damping elastic layer depicted in FIG. 10 and FIG. 12.

In addition, as depicted in FIG. 14, the vibration-damping elastic layers 4aA and 4bA can be ones that have three viscoelastic resin regions 41dA that are disposed separately from each other and a high-rigidity resin region 42dA that is disposed in a manner surrounding these viscoelastic resin regions 41dA. The viscoelastic resin regions 41dA, each of which is a rectangular parallelepiped region extending from one end of the CFRP layer 2A (CFRP layer 3A) along the longitudinal direction of the CFRP layers 2A and 3A, are approximately parallel to each other. In this case also, the viscoelastic resin regions 41dA and the high-rigidity resin region 42dA are alternately arranged along the direction intersecting the longitudinal direction of the CFRP layers 2A and 3A at least in the attachment portion BA.

Note that a material constituting each of the viscoelastic resin regions 41cA and 41dA is similar to the material constituting the viscoelastic resin region 41A according to the fourth embodiment. In addition, a high-rigidity resin constituting each of the high-rigidity resin regions 42cA and 42dA is similar to the high-rigidity resin constituting the high-rigidity resin regions 42aA according to the fifth embodiment.

Seventh Embodiment

As depicted in FIG. 15, a robot hand 1fA includes the main portion AA and the attachment portion BA that is provided in a manner extending from one end of the main portion AA and is held when the robot hand 1fA is incorporated into a robot. This robot hand 1fA also can be applied to an industrial robot for conveying glass substrates or semiconductor substrates, for example. In this case, the robot hand 1fA is fixed on the industrial robot via the attachment portion BA, and an object to be conveyed such as a glass substrate or a semiconductor substrate is placed on the main portion AA.

The robot hand 1fA includes a CFRP layer 2fA that is in a shape of elongated tube having a rectangular cross section, a CFRP layer 3fA that is laminated on the CFRP layer 2fA and is in a shape of elongated tube having a rectangular cross section, and a vibration-damping elastic layer 4fA disposed between the CFRP layer 2fA and the CFRP layer 3fA. The attachment portion BA is configured with one end portions of these CFRP layers 2fA and 3fA and the vibration-damping elastic layer 4fA. The CFRP layers 2fA and 3fA are manufactured by winding carbon fiber prepregs each of which is formed by impregnating a carbon fiber layer with a matrix resin (e.g., an epoxy resin) around a cored bar of aluminum or the like to laminate them and thermally curing them.

The vibration-damping elastic layer 4fA has a single viscoelastic resin region 41fA including a material containing a viscoelastic resin and a fibrous substance kneaded with the viscoelastic resin and a high-rigidity resin region 42fA including a high-rigidity resin that has higher rigidity than that of the viscoelastic resin. The viscoelastic resin region 41fA is a trapezoidal plate-like region extending from one ends to the other ends of the CFRP layers 2fA and 3fA, and is disposed on one side of the CFRP layer 2fA. The high-rigidity resin region 42fA is disposed on both sides of the viscoelastic resin region 41fA. The viscoelastic resin region 41fA and the high-rigidity resin region 42fA are alternately arranged (herein, in the order of the high-rigidity resin region 42fA, the viscoelastic resin region 41fA, and the high-rigidity resin region 42fA) along the direction intersecting the longitudinal direction of the CFRP layers 2fA and 3fA over the entire length of the robot hand 1fA.

Note that the viscoelastic resin region 41fA and the high-rigidity resin region 42fA can be ones including materials similar to those of the viscoelastic resin regions 41aA and the high-rigidity resin regions 42aA according to the fifth embodiment, respectively.

In the robot hand 1fA described above also, when it is incorporated into the robot, the attachment portion BA is held. In this case, between the CFRP layer 2fA and the CFRP layer 3fA, the vibration-damping elastic layer 4fA having the viscoelastic resin region 41fA including the material containing the viscoelastic resin and the fibrous substance that is kneaded with the viscoelastic resin and has relatively higher rigidity is disposed, which makes it possible to improve vibration-damping properties while maintaining flexural rigidity. In addition, because the viscoelastic resin region 41fA and the high-rigidity resin region 42fA having relatively higher rigidity are alternately arranged along the direction intersecting the longitudinal direction of the CFRP layers 2fA and 3fA in the attachment portion BA, flexural rigidity along the longitudinal direction of the CFRP layers 2fA and 3fA is improved.

Alternatively, the vibration-damping elastic layer 4fA can be, as depicted in FIG. 16, for example, one that has two viscoelastic resin regions 41gA that are disposed on one side of the CFRP layer 2fA and separated from each other and high-rigidity resin regions 42gA that are disposed on both sides of each of the viscoelastic resin regions 41gA. These viscoelastic resin regions 41gA, each of which is a rectangular parallelepiped region extending from one ends to the other ends of the CFRP layers 2fA and 3fA, are approximately parallel to each other. In this case also, the viscoelastic resin regions 41gA and the high-rigidity resin regions 42gA are alternately arranged along the direction intersecting the longitudinal direction of the CFRP layers 2fA and 3fA over the entire length of the robot hand 1fA.

Note that the viscoelastic resin regions 41gA and the high-rigidity resin regions 42gA include materials similar to those of the viscoelastic resin regions 41aA and the high-rigidity resin regions 42aA according to the fifth embodiment, respectively.

Herein, the viscoelastic resin regions 41fA and 41gA described above may be disposed on a plurality of sides of the CFRP layer 2fA, without being limited to the one side of the CFRP layer 2fA. For example, the viscoelastic resin regions 41fA and 41gA can be disposed on an upper surface of the CFRP layer 2fA and on a lower surface opposed to the upper surface thereof Herein, the upper surface and the lower surface of the CFRP layer 2fA are surfaces extending along the direction intersecting a vibration direction of the robot hand 1fA.

Furthermore, the viscoelastic resin regions 41fA and 41gA can be disposed on other two sides of the CFRP layer 2fA in addition to on the upper surface and the lower surface of the CFRP layer 2fA. When the viscoelastic resin regions 41fA and 41gA are disposed on a plurality of sides of the CFRP layer 2fA in this manner, vibration-damping properties can be further improved.

INDUSTRIAL APPLICABILITY

According to the present invention, it becomes possible to provide a robot hand making it possible to improve vibration-damping properties while maintaining flexural rigidity.

REFERENCE SIGNS LIST 1, 1a, 1d . . . robot hand, 2, 2d, 3, 3d . . . CFRP layer, 4, 4a, 4b, 4c, 4d, 4f . . . vibration-damping elastic layer, 41, 41a, 41b, 41c, 41d, 41f . . . viscoelastic resin region, 42, 42a, 42b, 42c, 42d, 42f . . . high-rigidity resin region, B . . . attachment portion, 1A, 1aA, 1bA, 1fA . . . robot hand, 2A, 2fA, 3A, 3fA . . . CFRP layer, 4A, 4aA, 4bA, 4fA . . . vibration-damping elastic layer, 41A, 41aA, 41bA, 41cA, 41dA, 41fA, 41gA . . . viscoelastic resin region, 42aA, 42bA, 42cA, 42dA, 42fA, 42gA . . . high-rigidity resin region, BA . . . attachment portion

The invention claimed is:

1. A robot hand having an attachment portion that is held when incorporated into a robot, the robot hand comprising:
    first and second carbon-fiber-reinforced plastic layers laminated to each other; and
    a vibration-damping elastic layer disposed between the first carbon-fiber-reinforced plastic layer and the second carbon-fiber-reinforced plastic layer, wherein
    the first and second carbon-fiber-reinforced plastic layers are plate-like and integrally formed with each other,
    the vibration-damping elastic layer includes a viscoelastic resin region including a viscoelastic resin and a high-rigidity resin region including a high-rigidity resin that has higher rigidity than that of the viscoelastic resin, and
    the viscoelastic resin region and the high-rigidity resin region are alternately arranged in the attachment portion,
    a number of viscoelastic resin regions is two or more in the attachment portion, and
    a number of high-rigidity resin regions is one more than the number of the viscoelastic resin regions in the attachment portion.

2. The robot hand according to claim 1, wherein
    the high-rigidity resin is the same as a resin constituting the first and the second carbon-fiber-reinforced plastic layers, and
    the high-rigidity resin region is integral with the first and the second carbon-fiber-reinforced plastic layers.

3. The robot hand according to claim 1, wherein, to the high-rigidity resin region, a heat-transfer medium flow path for circulating heat-transfer medium therethrough is provided along an outer border of the viscoelastic resin region.

4. A robot hand, comprising:
    first and second carbon-fiber-reinforced plastic layers laminated to each other; and
    a vibration-damping elastic layer disposed between the first carbon-fiber-reinforced plastic layer and the second carbon-fiber-reinforced plastic layer, wherein
    the vibration-damping elastic layer includes a viscoelastic resin region of a material containing a viscoelastic resin and a fibrous substance kneaded with the viscoelastic resin,
    the fibrous substance has higher rigidity than a rigidity of the viscoelastic resin, and
    an aspect ratio of a length of the fibrous substance divided by a diameter of the fibrous substance is within a range of 5 or more and 600 or less.

5. The robot hand according to claim 4, wherein
    the vibration-damping elastic layer further includes a high-rigidity resin region including a high-rigidity resin that has higher rigidity than a rigidity of the viscoelastic resin, and
    the viscoelastic resin region and the high-rigidity resin region are alternately arranged in an attachment portion that is held when the robot hand is incorporated into a robot.

6. The robot hand according to claim 5, wherein
    the high-rigidity resin is the same as a resin constituting the first and the second carbon-fiber-reinforced plastic layers, and
    the high-rigidity resin region is integral with the first and the second carbon-fiber-reinforced plastic layers.

7. The robot hand according to claim 5, wherein
    to the high-rigidity resin region, a heat-transfer medium flow path for circulating heat-transfer medium therethrough is provided along an outer border of the viscoelastic resin region.

8. The robot hand according to claim 4, wherein the fibrous substance is at least one out of carbon nanotube, Ketjenblack, short glass fiber, and short carbon fiber.

* * * * *